United States Patent [19]

Hamuro et al.

[11] Patent Number: 5,364,014

[45] Date of Patent: Nov. 15, 1994

[54] METHOD OF AND APPARATUS FOR MANUFACTURING ELECTRONIC COMPONENT

[75] Inventors: Mitsuro Hamuro; Shigeyoshi Matsuda; Shoichi Kawabata, all of Kyoto, Japan

[73] Assignee: Murata Manufacturing Co., Ltd., Kyoto, Japan

[21] Appl. No.: 158,605

[22] Filed: Nov. 29, 1993

[30] Foreign Application Priority Data

Nov. 27, 1992 [JP] Japan ................... 4-318836

[51] Int. Cl.⁵ ................... H01G 13/00; H01C 17/00
[52] U.S. Cl. ................... 228/248.1; 228/254; 228/49.5; 118/226; 427/123; 427/383.7
[58] Field of Search ............ 228/248.1, 254, 49.5; 118/225, 226, 503; 427/123, 383.7, 405

[56] References Cited

U.S. PATENT DOCUMENTS 4,607,782  8/1986  Mims ................... 228/248.1
4,766,844  8/1988  Brewer et al. ................ 228/254
5,216,573  6/1993  Kulkarni ................ 361/321

Primary Examiner—Samuel M. Heinrich
Attorney, Agent, or Firm—Ostrolenk, Faber, Gerb & Soffen

[57] ABSTRACT

A component body is held by a holder while projecting both end portions thereof respectively, and two applicators are simultaneously approached toward related end portions of the component body. The applicators are provided with paste films respectively, so that the respective end portions of the component body are located in the paste films as the result of the aforementioned approaching. Then, the applicators are separated from the component body, so that the component body coated with paste materials on the both end portions can be obtained. Conductor paste materials can be efficiently applied to the both end portions of the component body, while the widths of the conductor paste materials which are applied onto the both end portions can be made equal to each other.

14 Claims, 7 Drawing Sheets

METHOD OF AND APPARATUS FOR MANUFACTURING ELECTRONIC COMPONENT

BACKGROUND OF THE INVENTION

1. Field of the Invention

The present invention relates to a method of and an apparatus for manufacturing an electronic component, and more particularly, it relates to a method of and an apparatus for applying paste materials to both end portions of a component body thereby forming external terminal electrodes on a chip-type electronic component, for example.

2. Description of the Background Art

Figure 12:
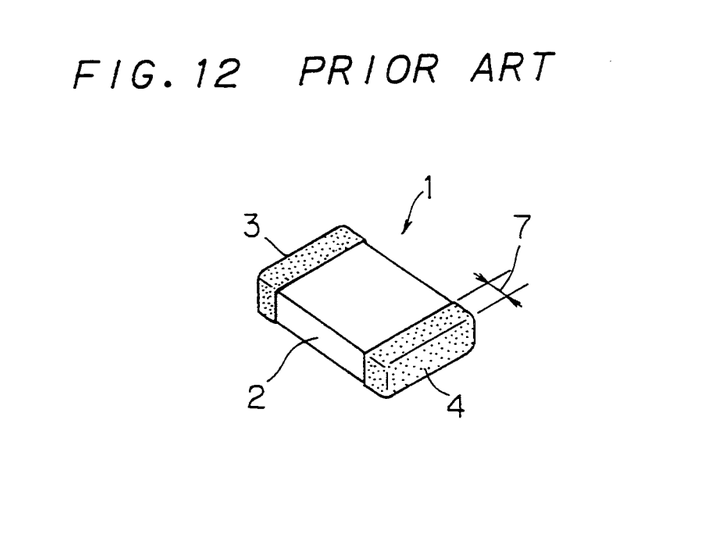
FIG. 12 is a perspective view showing the appearance of an electronic component 1 which is of interest to the present invention.

FIG. 12 shows a chip-type electronic component 1, which is of interest to the present invention. The electronic component 1 such as a multilayer ceramic capacitor, a multilayer chip inductor or a chip resistor has an appearance shown in FIG. 12. This electronic component 1 comprises a component body 2 and external terminal electrodes 3 and 4 which are formed on both end portions thereof. These external terminal electrodes 3 and 4 are formed by applying conductor paste materials such as Ag—Pd paste materials or Ag paste materials to both end portions of the component body 2 and baking the same. Such an electronic component 1 is of a surface-mountable type.

Figure 13:
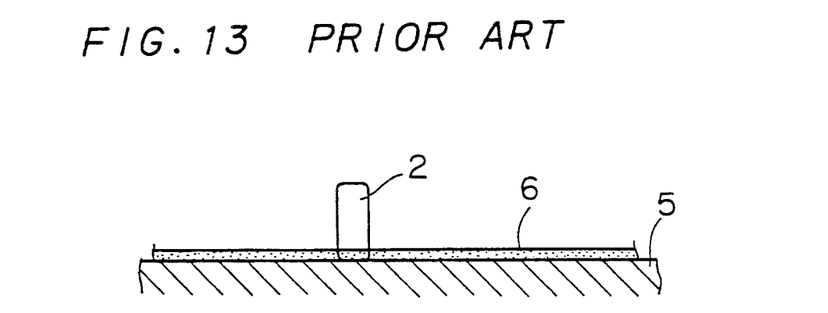
FIG. 13 is an illustrative sectional view for illustrating a conventional method for applying a conductor paste material to an end portion of an electronic component body 2.

FIG. 13 shows a step of applying conductor paste materials to end portions of the component body 2 for defining the external terminal electrodes 3 and 4. An applicator 5 of a metal plate, for example, is formed thereon with a film 6 of a conductor paste material in a uniform thickness. Then, an end portion of the component body 2 is located in the paste film 6 and thereafter the component body 2 is separated from the paste film 6, so that the conductor paste material is applied to the end portion of the component body 2. Then, this conductor paste material is dried and thereafter the component body 2 is inverted so that another end thereof is located in the paste film 6 this time. Then, the component body 2 is taken out from the paste film 6, and the conductor paste material which is applied to the other end portion is thereafter dried. Thereafter the conductor paste materials are so fired as to define the external terminal electrodes 3 and 4 respectively.

While FIG. 13 simply illustrates a step of treating a single component body 2, this treatment is generally simultaneously carried out on a plurality of such component bodies 2, which are held by a proper holder.

However, an operation which must be carried out in order to provide the aforementioned external terminal electrodes 3 and 4 is not much efficient. Namely, a step of applying the conductor paste material to one end portion of the component body 2 is carried out independently of a step of applying the conductor paste material to the other end portion, while steps of drying the conductor paste materials are carried out after these steps respectively. Consequently, a relatively large number of steps are required for forming the external terminal electrodes 3 and 4, and hence much time is required in order to obtain a single electronic component 1.

Figure 14:
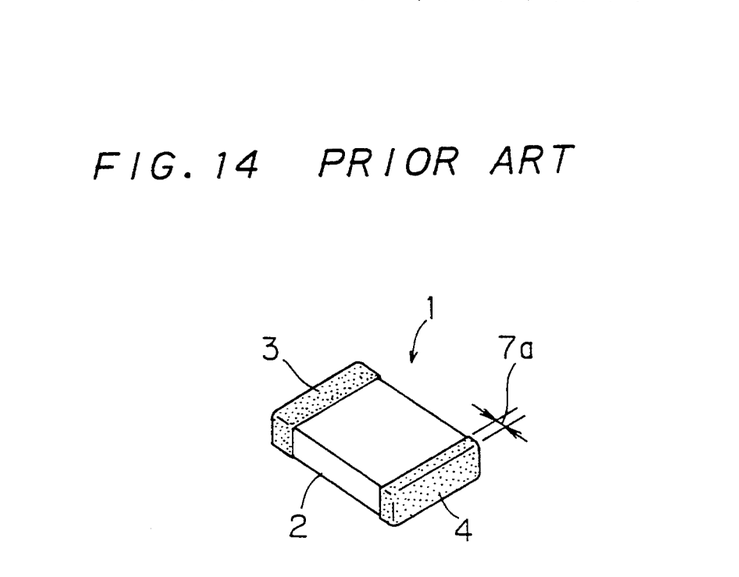
FIG. 14 is a perspective view of an electronic component 1 for illustrating a problem of the prior art.

In the as-obtained electronic component 1, it is desirable that each of the external terminal electrodes 3 and 4 has a cross-directional dimension 7 within a constant range. If the holder holding a plurality of component bodies 2 and the applicator 5 are in inferior parallelism or the component bodies 2 are not normally but inclinedly held by the holder, for example, however, parts of the electronic components 1 may be exposed to inconvenience such as that shown in FIG. 14. Referring to FIG. 14, a cross-directional dimension 7a of the external terminal electrode 4, for example, is below a standard range. Similarly, the cross-directional dimension of the external terminal electrode 3 and/or 4 may exceed the standard range.

SUMMARY OF THE INVENTION

Accordingly, an object of the present invention is to provide a method of and an apparatus for manufacturing an electronic component, which can solve the aforementioned problems.

A method of manufacturing an electronic component according to the present invention comprises the following steps: First, at least one component body having two ends in opposite positions is prepared. Further, a holder is prepared for holding the component body in a position between the end portions thereof while projecting the end portions respectively. In addition, two applicators provided with films of paste materials to be applied to the end portions of the component body are prepared. The component body is held by the holder while projecting the end portions respectively. The applicators are directed to the respective end portions of the component body which is held by the holder, and simultaneously approached toward related end portions of the component body, so that the respective end portions of the component body are located in the respective paste films. Then, the applicators are separated from the component body, whereby the component body coated with the paste materials on the end portions is obtained.

When the aforementioned respective steps are carried out in relation to a plurality of component bodies, the holder is preferably formed by a long tape-type holder having a plurality of receiving holes for resiliently receiving the respective component bodies in positions between the end portions thereof. In this case, a step of inserting the respective component bodies in the plurality of receiving holes in a first position while feeding the tape-type holder along its longitudinal direction for making the tape-type holder hold the respective component bodies and a step of the driving applicators in a second position thereby simultaneously applying paste materials to the both end portions of the component bodies are carried out.

On the other hand, an apparatus for manufacturing electronic components according to the present invention comprises a long tape-type holder having a plurality of receiving holes for resiliently receiving a plurality of component bodies, means for feeding the tape-type holder along a prescribed path in its longitudinal direction, means for inserting the respective component bodies in the plurality of receiving holes to project both end portions of the component bodies respectively on a first position of the prescribed path thereby making the tape-type holder hold the plurality of component bodies, two applicators which are provided to be simultaneously approached to and separated from each other for applying paste materials to respective end portions of the respective component bodies on a second position of the prescribed path downstream the first position and formed with films of the paste materials to be applied to the end portions of the component bodies respectively, and means for drying the paste materials which are applied to the both end portions of the respective component bodies on a third position of the prescribed path downstream the second position.

Thus, the present invention is characterized in that two applicators are simultaneously driven with respect to the end portions of the component body, to simultaneously apply the paste materials thereto. When two applicators are simultaneously driven in the aforementioned manner, the time for applying the paste materials is reduced as compared with the case of separately driving an applicator on respective end portions of a component body, while the component body is forcibly centered between the two applicators by pressing force exerted on the component body by the applicators. The latter action can be further expected particularly when the holder resiliently holds the component body.

According to the present invention, therefore, the paste materials are simultaneously applied to both end portions of the component body, whereby application of the paste materials can be efficiently carried out as compared with the case of separately carrying out steps of applying the paste materials to respective end portions. When it is necessary to dry the paste materials, such a drying step can be simultaneously carried out on the paste materials which are applied to the both end portions, whereby the total time required for drying can be reduced while energy required for such drying can also be saved.

According to the present invention, further, the two applicators are adapted to center the component body which is held therebetween when the same are simultaneously approached to each other. Consequently, the cross-directional dimensions of the paste materials which are applied to the both end portions of the component body are substantially equal to each other if the paste films which are formed on the two applicators are identical in thickness to each other. Therefore, it is possible to prevent an improper cross-directional dimension such as that shown in FIG. 14, for example.

When the holder can hold a plurality of component bodies in the present invention, it is possible to further efficiently apply the paste materials since the same are simultaneously applied to both end portions of the plurality of component bodies. In this case, the holder distributes the plurality of component bodies so that respective end portions thereof are planarly aligned with each other, while the paste films which are formed on the applicators are prepared to have areas covering distributed regions of the plurality of component bodies.

When the holder is formed by a long tape-type holder having a plurality of receiving holes for resiliently receiving component bodies, it is possible to continuously carry out a step of inserting the respective component bodies in the plurality of receiving holes while feeding such a tape-type holder along its longitudinal direction, and a step of applying paste materials to the respective end portions of the component bodies which are received in the receiving holes in parallel with each other. When a drying step is added after the aforementioned steps, further, such a drying step can also be carried out in parallel with the other steps, whereby the overall treatment operation can be extremely efficiently carried out.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is an enlarged sectional view showing the component body 2, both end portions of which are located in paste films 17 and 17a;

DESCRIPTION OF THE PREFERRED EMBODIMENTS

FIGS. 1 to 7 are diagrams for illustrating an embodiment of the present invention. This embodiment is adapted to obtain the electronic component 1 shown in FIG. 12. More particularly, this embodiment is adapted to apply conductor paste materials for forming the external terminal electrodes 3 and 4 onto both end portions of the component body 2.

Figure 1:
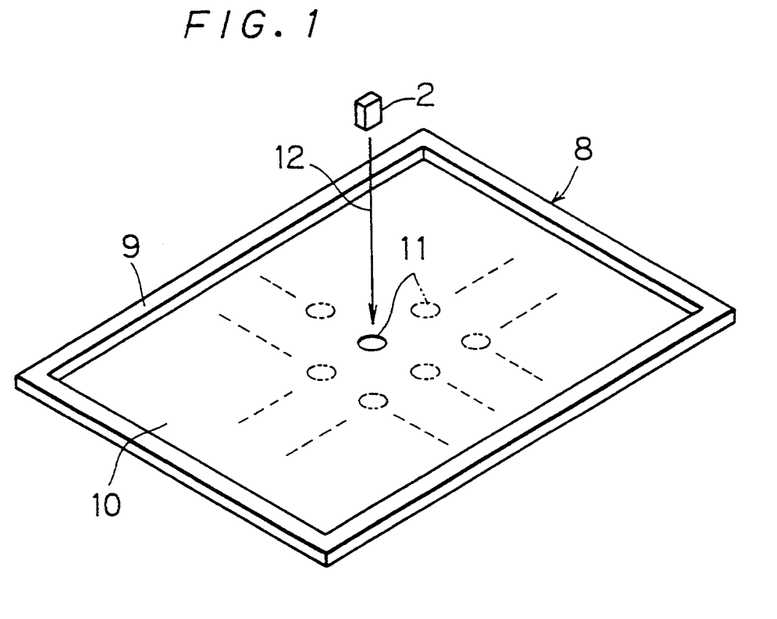
FIG. 1 is a perspective view showing a holder 8 and a component body 2 which are employed in an embodiment of the present invention in a separated manner.

FIG. 1 shows a component body 2 having a shape of a rectangular parallelopiped, for example. A holder 8 is prepared for holding this component body 2. This holder 8 comprises a frame 9 and a thin sheet 10 which is fixed to the frame 9. The sheet 10 is preferably made of a material which can withstand a temperature for drying conductor paste materials as described later. This sheet 10 is prepared from resin such as polyethylene terephthalate, or a metal, for example. The sheet 10 is provided with a receiving hole 1 for receiving the component body 2. The receiving hole 11 is made smaller than a sectional diagonal size of the component body 2, thereby resiliently holding the component body 2. The receiving hole 11 has a shape of a circle as shown in FIG. 1, for example, while the same may have another shape such as that of a triangle, a rectangle or another polygon.

As shown in solid and phantom lines in FIG. 1, a single holder 8 is preferably provided with a plurality of receiving holes 11, so that the holder 8 holds a plurality of component bodies 2 and respective end portions of the component bodies 2 are distributed to be planarly aligned with each other along the sheet 10. Such a plurality of component bodies 2 are treated substantially in the same manner, and hence the following description is made simply in relation to a single component body 2.

Figure 2:
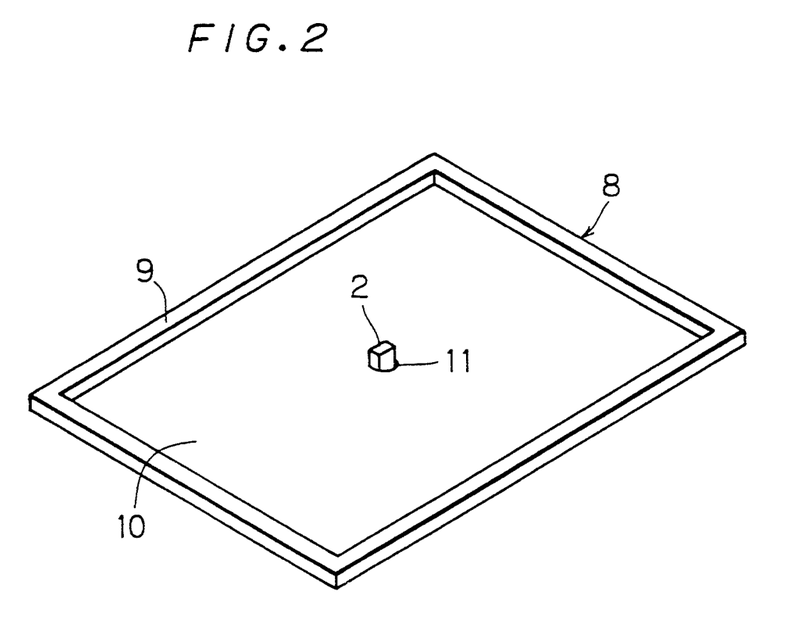
FIG. 2 is a perspective view showing the component body 2 appearing in FIG. 1, which is inserted in a receiving hole 11 provided in the holder 8.

The component body 2 is inserted in the receiving hole 11, as shown by arrow 12 in FIG. 1. FIG. 2 shows the component body 2 thus inserted in the receiving hole 11. Referring to FIG. 2, both end portions of the component body 2 are projected from the sheet 10 respectively, and a peripheral portion of the receiving hole 11 resiliently holds the component body 2 in a position between the both end portions thereof. This state is clearly shown in FIGS. 5, 6 and 7 as described later.

Figure 3:
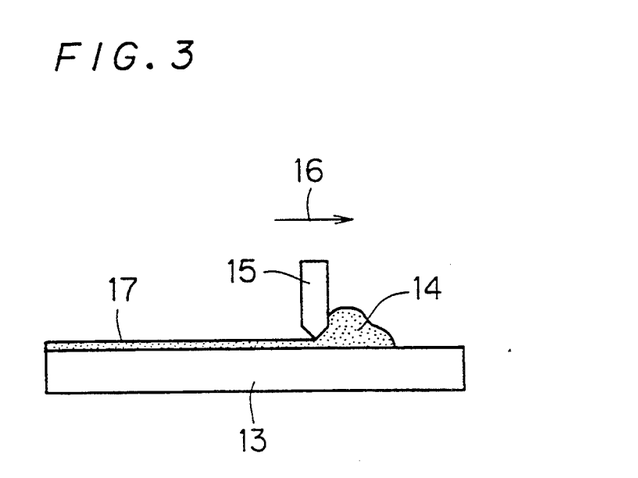
FIG. 3 is a front elevational view showing a step of forming a paste film 17 on an applicator 13 which is employed in the embodiment of the present invention.
Figure 4:
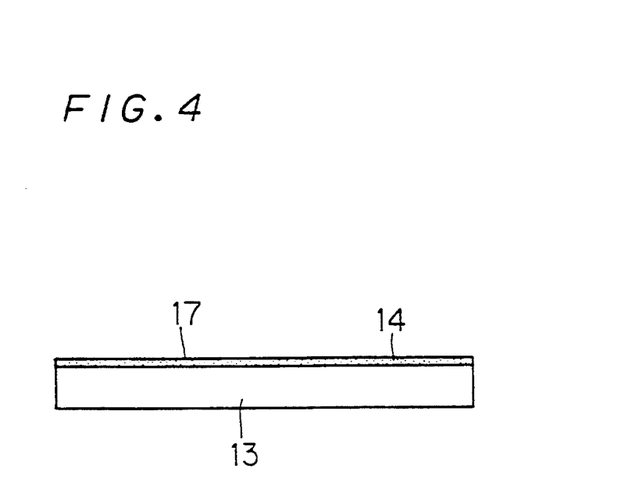
FIG. 4 is a front elevational view showing the applicator 13 which is provided with the paste film 17 along the step shown in FIG. 3.

On the other hand, FIG. 3 shows an applicator 13. This applicator 13 is formed by a metal plate, for example. A conductor paste material 14 is placed on this applicator 13 and a blade 15 is moved along arrow 16, thereby forming a film 17 of the conductor paste material 14 on the applicator 13 as shown in FIG. 4. While the blade 15 is moved along arrow 16, the blade 15 and the applicator 13 are maintained at a constant distance from each other. Therefore, the paste film 17 has a uniform thickness.

Figure 5:
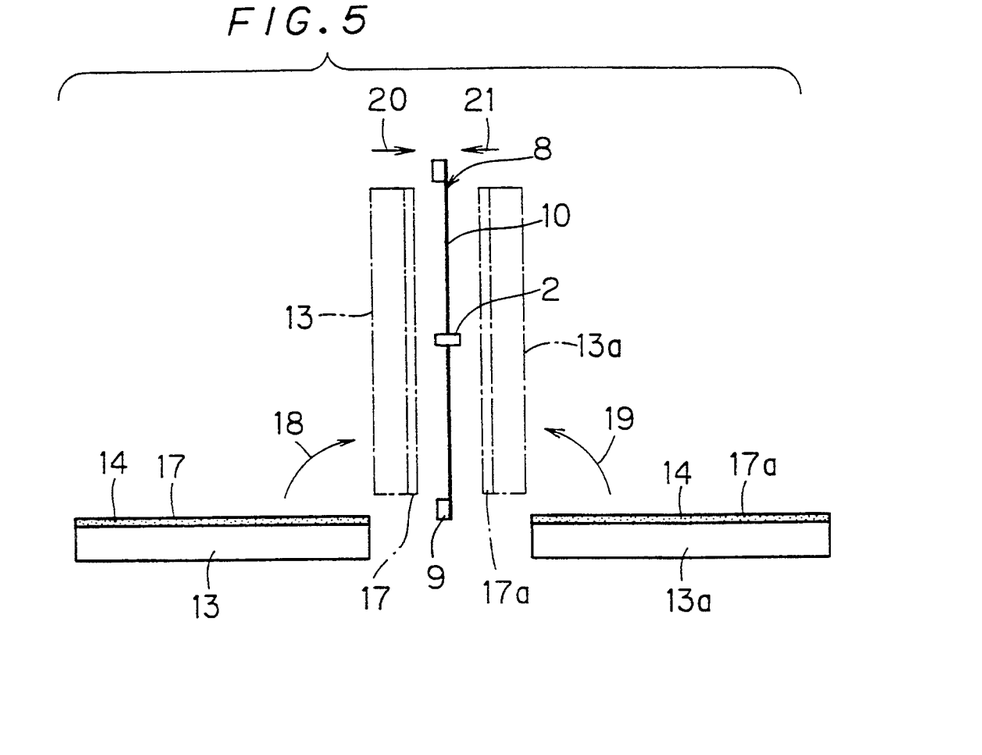
FIG. 5 is a front elevational view showing applicators 13 and 13a which are in a preparation stage for applying conductor paste materials 14 to both end portions of the component body 2 held by the holder 8.

FIG. 5 shows the applicator 13, which is provided with the paste film 17 appearing in FIG. 4. FIG. 5 also shows another applicator 13a which is provided with a paste film 17a by a similar method. The holder 8 holding the component body 2 shown in FIG. 2 is arranged between the two applicators 13 and 13a in an uprighted state.

The two applicators 13 and 13a are rotated along arrows 18 and 19 in FIG. 5, to be directed to the respective end portions of the component body 2 as shown by phantom lines in FIG. 5. Then, the two applicators 13 and 13a are approached toward related end portions of the component body 2 along arrows 20 and 21. It is important that such approaching operations are simultaneously carried out on the two applicators 13 and 13a.

Figure 6:
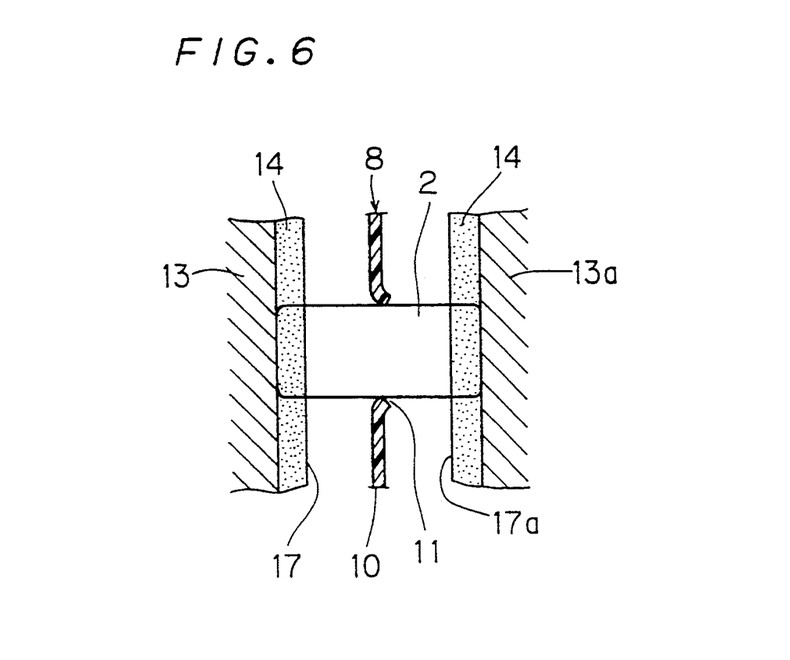

FIG. 6 shows the as-approached applicators 13 and 13a in an enlarged manner. As shown in FIG. 6, the end portions of the component body 2 are located in the paste films 17 and 17a respectively. At this time, the component body 2 can be centered between the two applicators 13 and 13a along the approaching operations. This component body 2 may be moved in the receiving hole 11 as the result of such centering.

When the applicators 13 and 13a are uprighted as shown in FIG. 6, the conductor paste materials 14 defining the paste films 17 and 17a may be moved along gravity to gradually downwardly increase the thicknesses of the paste films 17 and 17a. However, the conductor paste materials 14 have viscosity and the paste films 17 and 17a are not so large in thickness, whereby the paste films 17 and 17a can maintain uniform thicknesses in practice even when the applicators 13 and 13a are uprighted. It has been confirmed by an experiment that the paste films 17 and 17a can maintain uniform thicknesses when the conductor paste materials 14 have viscosity of 30 to 80 Pa and the paste films 17 and 17a are 1 to 2 mm in thickness.

Figure 7:
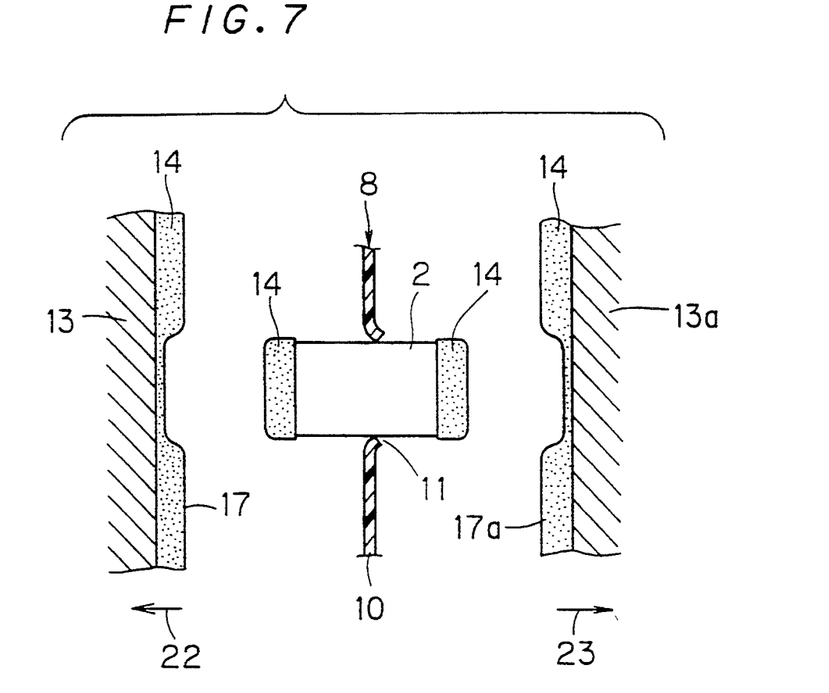
FIG. 7 is an enlarged sectional view showing the applicators 13 and 13a which are separated from the component body 2 after the step shown in FIG. 6.

Then, the two applicators 13 and 13a are moved along arrows 22 and 23 as shown in FIG. 7, whereby the component body 2 coated with the conductor paste materials 14 on both end portions can be obtained. When the applicators 13 and 13a are separated from the component body 2, it is not so important to simultaneously move the applicators 13 and 13a.

Then, the aforementioned component body 2 is subjected to a drying step in the state being held by the holder 8. In this drying step, the conductor paste materials 14 applied to the both end portions of the component body 2 are simultaneously dried. Then, the conductor paste materials 14 are so fired as to obtain the external terminal electrodes 3 and 4 shown in FIG. 12.

Figure 8:
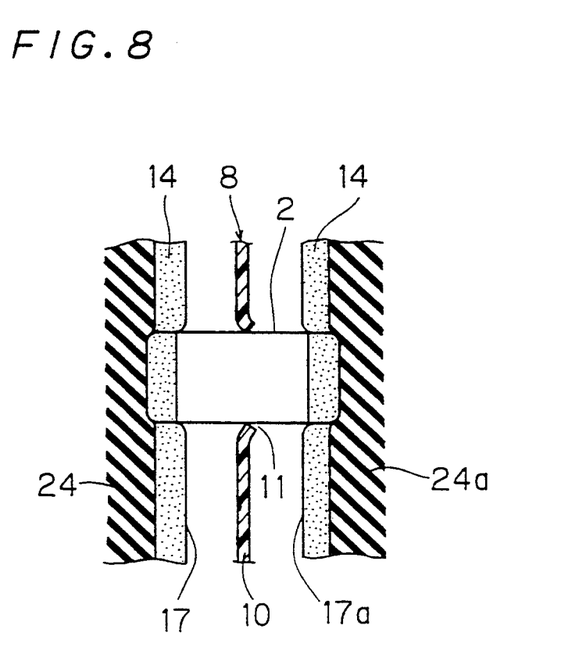
FIG. 8 is an enlarged sectional view corresponding to FIG. 6, showing applicators 24 and 24a which are employed in another embodiment of the present invention.

While the applicators 13 and 13a are made of a metal in the aforementioned embodiment, the same may alternatively be made of another material such as hard rubber, resin, foam rubber or foam resin, for example. When the applicators are made of a material such as rubber having proper elasticity, the following effect can be expected:

FIG. 8 shows applicators 24 and 24a of elastic bodies. Referring to FIG. 8, elements corresponding to the aforementioned ones are denoted by similar reference numerals, to omit redundant description.

When the applicators 24 and 24a of elastic bodies shown in FIG. 8 are approached to each other, it is possible to absorb impacts exerted on a component body 2 by indenting surfaces of the applicators 24 and 24a even if the same are moved beyond prescribed terminating positions. Thus, it is possible to protect the component body 2 against excessive internal stress, thereby preventing the component body 2 from damage such as chipping.

Figure 9:
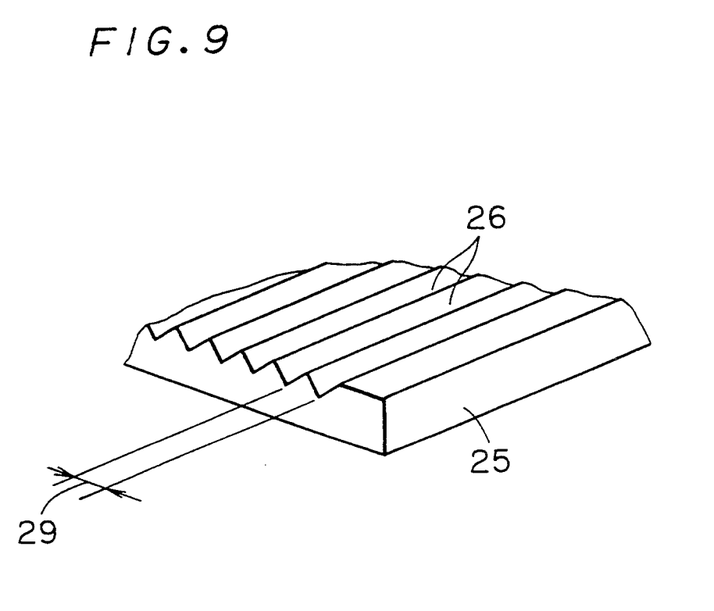
FIG. 9 is a perspective view showing a part of an applicator 25 which is employed in still another embodiment of the present invention.
Figure 10:
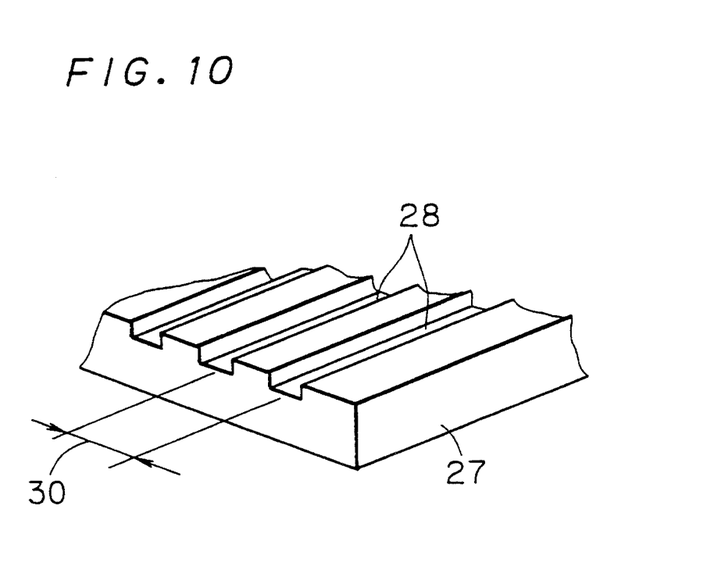
FIG. 10 is a perspective view showing a part of an applicator 27 which is employed in a further embodiment of the present invention.

The applicators may not have flat surfaces, to be provided with paste films. FIG. 9 shows an applicator 25, which is provided with a plurality of grooves 26 having V-shaped sections. On the other hand, FIG. 10 shows an applicator 27, which is provided with a plurality of grooves 28 having rectangular sections. Respective pitches 29 and 30 of these grooves 26 and 28 are coincident to arrangement pitches of plural component bodies which are held by single holders. The applicator may be provided with grooves having shapes other than those shown in FIGS. 9 and 10, while the grooves may extend not along one direction but in the form of a lattice.

Particularly when the applicator 25 having the V-shaped grooves 26 shown in FIG. 9 is employed, it is possible to apply a conductor paste material onto end surfaces of component bodies with sufficient thicknesses, since the grooves 26 are filled up with the conductor paste material. This effect can be also expected in an applicator having a coarse surface to be provided with a paste film.

Figure 11:
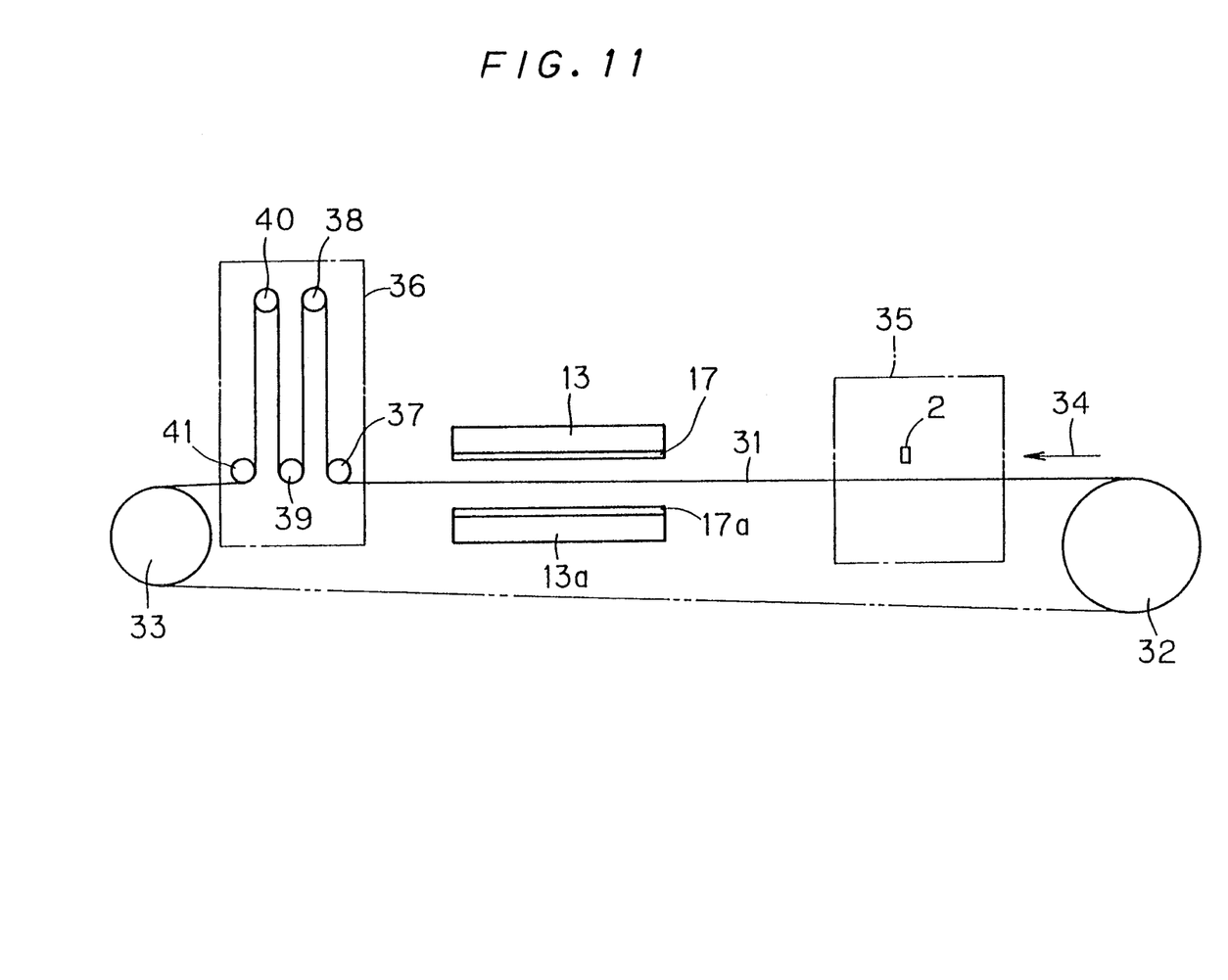
FIG. 11 is a front elevational view schematically showing an apparatus for carrying out a further embodiment of the present invention.

FIG. 11 shows a long tape-type holder 31. This tape-type holder 31 is formed by a heat-resistant film such as a polyethylene terephthalate film, for example. A plurality of receiving holes (not shown) are distributed in the holder 31. These receiving holes are substantially similar to the receiving hole 11 in the aforementioned embodiment. While such a holder 31 can be employed for carrying out operations similar to those shown in FIGS. 1 to 7, the holder 31 shown in FIG. 11 is adapted to continuously carry out these operations.

The tape-type holder 31 is fed from a supply roll 32 toward a take-up roll 33 along arrow 34. An inserting station 35 is arranged on a first position of such a feed path, for inserting a plurality of component bodies 2 in the plurality of receiving holes so that these component bodies 2 are held by the tape-type holder 31. Further, the aforementioned two applicators 13 and 13a are arranged on a second position of the feed path for the tape-type holder 31 downstream the inserting station 35, to hold the holder 31 therebetween. In addition, a drying station 36 is arranged on a third position of the feed path for the tape-type holder 31 downstream the applicators 13 and 13a. This drying station 36 is provided by a drying furnace utilizing electrical energy, for example, so that the tape-type holder 31 is staggerly guided along a plurality of rollers 37 to 41, to be supplied with a sufficient drying effect.

Operations carried out in the apparatus shown in FIG. 11 are substantially similar to those shown in FIGS. 1 to 7. In the inserting station 35, the respective component bodies 2 are inserted in the plurality of receiving holes, to be held by the tape-type holder 31 in a state projecting both end portions respectively. If the holder 31 which is supplied from the supply roll 32 is not previously provided with receiving holes, the receiving holes may be formed in this inserting station 35 or in a portion immediately ahead thereof. Then, the two applicators 13 and 13a are simultaneously approached to the respective end portions of the component bodies 2 in the portion where the applicators 13 and 13a are opposed to each other, thereby locating the end portions of the component bodies 2 in the paste films 17 and 17a respectively. Then, the applicators 13 and 13a are separated from the component bodies 2, whereby the component bodies 2 coated with the conductor paste materials on both end portions are obtained. The conductor paste materials which are applied to the both end portions of the component bodies 2 as hereinabove described are dried in the drying station 36.

As shown in a phantom line in FIG. 11, the tape-type holder 31 may be in an endless state, to be circulated from the inserting station 35 to the drying station 36.

While the present invention has been described with reference to some embodiments shown in the drawings, the present invention is not restricted to the case of applying conductor paste materials to both end portions of a component body, but is also applicable to a case of applying paste materials such as nonconductor paste materials, insulating paste materials or glass glaze materials.

Further, the component body is not restricted to the shape of a rectangular parallelopiped, but may have a cubic shape, a columnar shape or another shape.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an electronic component, comprising the steps of:
   preparing at least one component body having two end portions in opposite positions;
   preparing a holder for holding said component body in a position between said end portions of said component body while projecting said end portions respectively;
   preparing two applicators being provided with films of paste materials to be applied to said end portions of said component body respectively;
   holding said component body by said holder while projecting said end portions respectively;
   simultaneously approaching said two applicators toward related said end portions of said component body while directing said applicators to said end portions of said component body being held by said holder, thereby locating said end portions of said component body in respective said paste films; and
   separating said applicators from said component body, thereby obtaining said component body being coated with said paste materials on said end portions.

2. A method of manufacturing an electronic component in accordance with claim 1, wherein said holder resiliently holds said component body in said position between said end portions of said component body.

3. A method of manufacturing an electronic component in accordance with claim 1, wherein said holder distributes a plurality of said component bodies to planarly align respective said end portions with each other, said paste films being provided on said applicators having areas covering distributed regions of said plurality of component bodies.

4. A method of manufacturing an electronic component in accordance with claim 1, wherein said step of approaching said two applicators toward said component body includes a step of centering said component body between said two applicators.

5. A method of manufacturing an electronic component in accordance with claim 1, further comprising a step of drying said paste materials being applied to said component body while holding said component body by said holder.

6. A method of manufacturing an electronic component in accordance with claim 5, wherein said holder is made of a material capable of withstanding a temperature provided in said drying step.

7. A method of manufacturing an electronic component in accordance with claim 1, wherein surfaces of said applicators being provided with said paste films are formed with grooves.

8. A method of manufacturing an electronic component in accordance with claim 1, wherein at least surfaces of said applicators being provided with said paste films are formed by elastic bodies.

9. A method of manufacturing an electronic component in accordance with claim 1, wherein said paste materials are conductor paste materials.

10. A method of manufacturing electronic components, comprising the steps of:
    preparing a plurality of component bodies each having two end portions in opposite positions;
    preparing a long tape-type holder having a plurality of receiving holes for resiliently receiving respective said electronic components in positions between said end portions of said component bodies;
    preparing two applicators being provided with films of paste materials to be applied to said end portions of said component bodies respectively;
    feeding said tape-type holder along its longitudinal direction to successively pass through first and second positions being different from each other;

inserting said component bodies in said plurality of receiving holes in said first position for making said tape-type holder hold said component bodies while projecting said end portions of said component bodies respectively; and simultaneously approaching said two applicators toward said end portions of said component bodies while directing said applicators to said end portions of said component bodies in said second portion thereby locating said end portions of said component bodies in respective said paste films, and then separating said applicators from said component bodies thereby obtaining said component bodies being coated with said paste materials on said end portions.

11. A method of manufacturing electronic components in accordance with claim 10, wherein said paste materials are conductor paste materials.

12. A method of manufacturing electronic components in accordance with claim 10, wherein said holder is made to pass through a third position following said second position in said step of feeding said tape-type holder along its longitudinal direction, said method further comprising a step of drying said paste materials being applied to said component bodies in said third position.

13. A method of manufacturing electronic components in accordance with claim 12, wherein said tape-type holder is formed by a heat-resistant film.

14. An apparatus for manufacturing electronic components, comprising:

a long tape-type holder having a plurality of receiving holes for resiliently receiving a plurality of component bodies;

means for feeding said tape-type holder along a prescribed path in its longitudinal direction;

means for inserting said component bodies in said plurality of receiving holes respectively for projecting end portions of said component bodies on a first position of said prescribed path to make said tape-type holder hold said plurality of component bodies;

two applicators being provided to be simultaneously approached to and separated from each other for applying paste materials to said end portions of said component bodies on a second position of said prescribed path downstream said first position, said applicators being provided with films of said paste materials to be applied to said end portions of said component bodies; and means for drying said paste materials being applied to said end portions of said component bodies on a third position of said prescribed path downstream said second position.

* * * * *